United States Patent
Dennis et al.

[19]

[11] Patent Number: 6,040,616
[45] Date of Patent: Mar. 21, 2000

[54] DEVICE AND METHOD OF FORMING A METAL TO METAL CAPACITOR WITHIN AN INTEGRATED CIRCUIT

[75] Inventors: Donald C. Dennis; Joseph R. Radosevich; Ranbir Singh, all of Orlando, Fla.

[73] Assignee: Lucent Technologies Inc., Murray Hill, N.J.

[21] Appl. No.: 08/909,563

[22] Filed: Aug. 12, 1997

Related U.S. Application Data

[63] Continuation-in-part of application No. 08/472,033, Jun. 6, 1995, Pat. No. 5,654,581.

[51] Int. Cl.[7] .................................................. H01L 29/00
[52] U.S. Cl. .............................................. 257/535; 257/532
[58] Field of Search ................................ 257/532, 534, 257/535

[56] References Cited

U.S. PATENT DOCUMENTS

| | | | |
|---|---|---|---|
| 4,855,952 | 8/1989 | Kiyosumi | 365/149 |
| 5,005,102 | 4/1991 | Larson | 361/313 |
| 5,089,869 | 2/1992 | Matsuo et al. | 357/23.6 |
| 5,101,251 | 3/1992 | Wakamiya et al. | 357/23.6 |
| 5,108,941 | 4/1992 | Paterson et al. | 437/47 |
| 5,307,310 | 4/1994 | Narita | 365/149 |
| 5,406,447 | 4/1995 | Miyazaki | 301/313 |
| 5,418,388 | 5/1995 | Okudaira et al. | 257/295 |
| 5,420,449 | 5/1995 | Oji | 257/307 |
| 5,436,477 | 7/1995 | Haschizume et al. | 257/310 |
| 5,478,772 | 12/1995 | Fazan | 437/60 |
| 5,479,316 | 12/1995 | Smrtic et al. | 361/322 |
| 5,644,158 | 7/1997 | Fujii et al. | 257/532 |
| 5,654,581 | 8/1997 | Radosevich et al. | 257/534 |
| 5,684,304 | 11/1997 | Smears | 257/48 |
| 5,717,233 | 2/1998 | Fujii et al. | 257/295 |
| 5,773,860 | 6/1998 | Kijima et al. | 257/306 |
| 5,841,160 | 11/1998 | Nakamura | 257/295 |

*Primary Examiner*—Ngân V. Ngô

[57] ABSTRACT

The present invention provides, for use in an integrated circuit structure having a prior level that includes a foundation dielectric formed over a conductive polycrystalline material, a capacitor comprising first and second electrodes having a capacitor dielectric formed therebetween. The first electrode is formed immediately over the prior level and extends beyond a common area of the first and second electrodes and connects the capacitor to the prior level outside of the common area. The capacitor is free of a direct electrical contact with the prior level; that is, the capacitor is not connected to the prior level by a window or other interconnect structure that extends directly from the capacitor itself within the common area. Electrical connection of the capacitor to the prior level is made outside the common area of the capacitor.

10 Claims, 3 Drawing Sheets

DEVICE AND METHOD OF FORMING A METAL TO METAL CAPACITOR WITHIN AN INTEGRATED CIRCUIT

RELATED APPLICATION

This is a continuation-in-part of U.S. Ser. No. 08/472,033, which was filed on Jun. 6, 1995, now U.S. Pat. No. 5,654,581 and which is incorporated herein by reference for all purposes.

TECHNICAL FIELD OF THE INVENTION

The present invention is directed, in general, to semiconductor fabrication and, more specifically, to an integrated circuit and a method of manufacture therefore.

BACKGROUND OF THE INVENTION

Capacitors are used extensively in electronic devices for storing an electric charge. The capacitors essentially comprise two conductive plates separated by an insulator. The capacitance, or amount of charge held by the capacitor per applied voltage, is measured in farads and depends upon the area of the plates, the distance between them, and the dielectric value of the insulator. Capacitors are used in filters, in analog-to-digital converters (ADCs) in memories, and various control applications.

Capacitors in integrated circuits are usually fabricated from polysilicon, metal to polysilicon or metal to polycide structures. In most applications, such as in analogue to digital converters (ADC's), a capacitor whose capacitance does not vary with voltage is needed. A measure of the variation of capacitance with applied voltage is called the voltage coefficient of capacitance (VOC) measured in parts per million. Generally, the VOC of capacitors used on integrated circuits is not zero (50–300 ppm) and hence needs to be nulled. Circuit techniques that employ null methods assume that the variation of VOC with voltage, while not zero, is a linear function of voltage, which is not a valid assumption in integrated circuit capacitors. Furthermore, while these techniques increase precision and resolution of ADC's they consume chip area, and hence increase chip cost. If the VOC of the capacitors is less than a few ppm, one does not need to employ null circuit techniques, thereby reducing circuit complexity and cost.

U.S. Pat. No. 5,108,941 to Paterson et al. discloses a method of making a metal to polysilicon type capacitor having a low VOC as compared to polysilicon type capacitors. In the Paterson et al. method the bottom plate of the capacitor is formed over a field oxide structure, and the multilevel dielectric is deposited thereover. The multilevel dielectric is removed from the capacitor area, and an oxide/nitride dielectric is deposited over the exposed bottom plate and over the multilevel dielectric by way of low pressure chemical vapor deposition ("LPCVD"). A first layer of titanium/tungsten is preferably deposited prior to contact etch, and the contacts to moat and unrelated polysilicon are formed. Metallization is sputtered overall, and the metal and titanium/tungsten are cleared to leave the metallization filling the contact holes, and a capacitor having a titanium/tungsten and metal top plate.

Other disadvantages associated with prior art devices include parasitic capacitance which arises when the intended capacitor and the parasitic capacitor are positioned too close together within the integrated circuit. Conventional designs do not provide for relatively large separation distances between the intended capacitor and the parasitic capacitor because of size restrictions. Moreover, the capacitor is typically connected directly to the polysilicon located on the prior level within the integrated circuit device. Further, conventional capacitor designs typically have non-planar surfaces associated therewith, and as such, the dielectric may not be uniformly deposited over the capacitor area, which may consequently promote voltage breakdown of the capacitor.

In any fabrication process, simplicity is an advantage. Thus, a fabrication method which can achieve the same or better quality product with the same cost of materials while using fewer steps is highly preferred, especially if elimination of fabrication steps reduces labor costs and the need for expensive manufacturing equipment. A new structure built from materials already being used in the fabrication process is preferred since it reduces materials development efforts and the need for expensive manufacturing equipment.

It is also desirable to have flexibility in the processing steps for fabricating integrated circuits. Particularly, it is highly advantageous to have a modular process forming a capacitor, i.e. a process that can be added as an option to an existing digital process with no changes in sequence operations. Employing a silicide metal on polysilicon ("polycide") as contemplated in U.S. Pat. No. 5,108,941 entails siliciding the entire polysilicon layer to achieve the optimum voltage stability. However, siliciding sharply reduces processing flexibility. For example, with a silicide structure heat treatment of the integrated circuit for such purposes as annealing, diffusion, driving in dopants, smoothing interlevel dielectrics and the like, is limited to temperatures below about 850° C. It would be advantageous to be able to use temperatures above 850° C. and to be able to form low VOC capacitors at various stages of integrated circuit fabrication.

SUMMARY OF THE INVENTION

The present invention provides, for use in an integrated circuit structure having a prior level that includes a foundation dielectric, a capacitor comprising first and second electrodes having a capacitor dielectric formed therebetween. The first electrode is formed immediately over the prior level and a portion of the first electrode overlaps the second electrode to form a common area. The first electrode extends beyond the common area of the first and second electrodes and connects the capacitor to the prior level outside of the common area. Electrical connection of the capacitor to the prior level is made outside the common area of the capacitor.

In one embodiment, the capacitor is substantially planar. In this particular embodiment, the first and second electrodes and the capacitor dielectric are deposited on a substantially planar or flat surface, which is preferably the foundation dielectric. This substantially planar deposition surface allows uniform deposition of the electrodes and capacitor dielectric, which lessens voltage breakdown problems associated with step coverage.

In another embodiment first electrode is comprised of first and second layers of conductive material. The first layer is preferably comprised of titanium and said second layer is preferably comprised of titanium nitride. However, it should, of course, be appreciated that conductive materials known to those skilled in the art could be used in alternative embodiments. The second electrode preferably comprised of aluminum, and the capacitor dielectric is preferably comprised of silicon dioxide. In more advantageous embodiments, the silicon dioxide is deposited by plasma enhanced chemical vapor deposition.

In another aspect of the present invention, the capacitor is electrically connected to the prior level by a window positioned or located outside the common area. This eliminates the need to connect the capacitor to the prior level by a window extending directly from the capacitor itself. This aspect provides the advantage of being able to place the capacitor at any level within the integrated structure, thereby substantially reducing parasitic capacitance problems, and also offers the advantage of allowing the capacitor to be formed on a planar surface, thereby providing a capacitor with the above-discussed attendant advantages. In another aspect of this particular embodiment, the first electrode of the capacitor extends into the window thereby to indirectly connect the capacitor to the prior level.

In another embodiment, the first and second electrodes are simultaneously defined from the same patterning and etch process, which provides a self-aligned capacitor. Since both the first and second electrodes are simultaneously defined by the same patterning and etch process, the second electrode does not have to be separately patterned and etched from the first electrode. Therefore, the capacitor's fabrication within the integrated circuit can be repeated with greater consistency.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
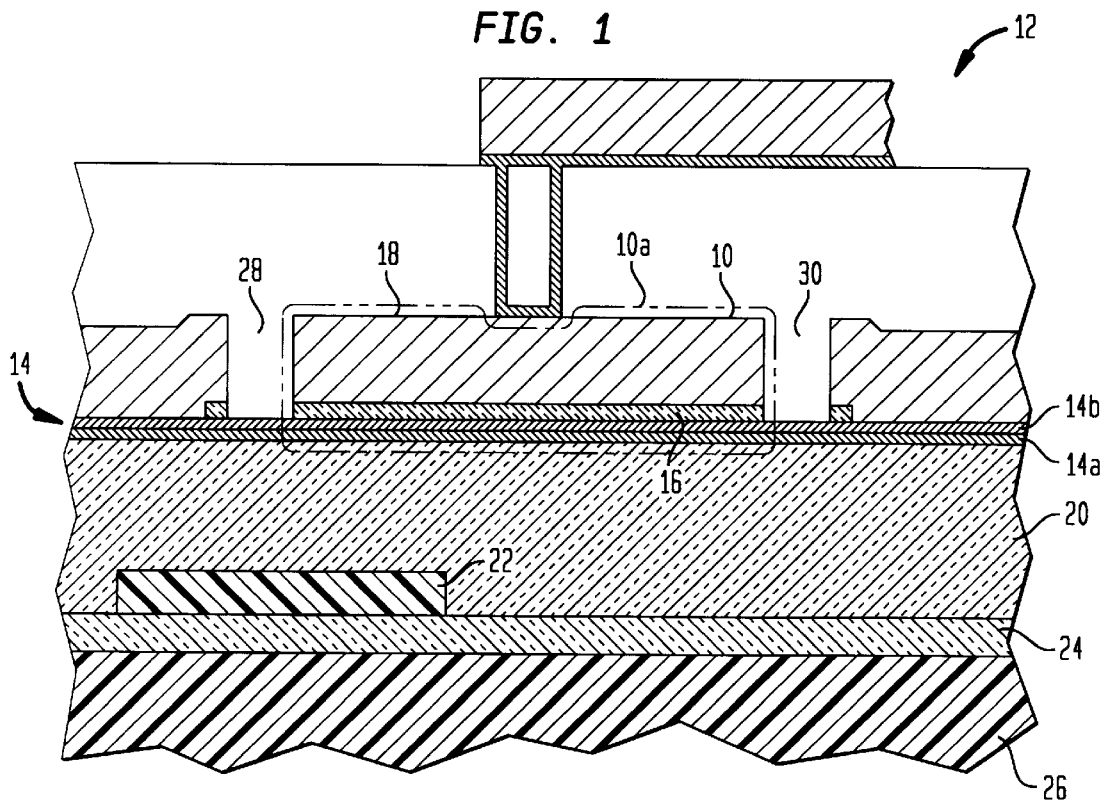
FIG. 1 illustrates a schematic cross-sectional diagram of the metal to metal capacitor constructed according to a method described herein.

In FIG. 1 there is illustrated a cross-sectional diagram of the metal to metal capacitor 10 constructed according to a method described herein, which may be incorporated within an integrated circuit. The overall structure of the capacitor 10 is preferably substantially planar as illustrated in FIG. 1 and may be included within an integrated circuit 12, of which only a portion is illustrated. For reasons discussed below, the capacitor 10 is formed over a substantially planar surface, which allows for more uniform deposition of the layers that comprise the capacitor 10. The substantially planar orientation of the capacitor 10 avoids the nonuniform deposition problems, such as voltage breakdown and reproducibility of the capacitor within the integrated circuit 12, associated with step coverage that occurs when the capacitor 10 is deposited in a window or via.

The capacitor 10 comprises a lower electrode 14, capacitor dielectric 16, and an upper electrode 18. The capacitor 10 is formed over a dielectric layer 20, which is deposited over a polycrystalline silicon ("polysilicon") layer 22. The polysilicon layer 22 is typically formed over the top of a field oxide ("FOX") dielectric layer 24 that is disposed on a silicon substrate 26. The dielectric layer 20, polysilicon layer 22 and the dielectric layer 24 constitute prior levels with respect to the capacitor 10 since those levels are levels over which the capacitor 10 may be deposited. It should be specifically understood however, that the capacitor 10 of the present invention, or a plurality thereof, may also be deposited at any subsequent level above that illustrated in FIG. 1. The substrate may be a p-type, n-type or other type of doped dielectric known to those skilled in the art.

As illustrated in one embodiment, the upper electrode 18 is separated from other portions of the integrated circuit by gaps 28 and 30, while the lower electrode 14 extends to other portions of the integrated circuit 12. At least a portion of the areas of the lower electrode 14 and the upper electrode 18 overlap to form a capacitor area 10a, or common area (generally encompassed by the dashed line), which is not directly connected to prior levels of the integrated circuit 12. More broadly, the capacitor area 10a is defined as the common intersection or overlap of surface areas of the lower and upper electrodes 14 and 18. The capacitor 10 is connected only indirectly to other levels that contact the lower electrode 14 outside of the capacitor area 10a and is not connected directly to any prior level by a window or contact opening. In a preferred embodiment, the capacitor 10 will be connected to prior levels by a window 40 that is positioned and contacts the lower electrode 14 outside the capacitor area 10a. This aspect of the present invention eliminates the need of forming the capacitor 10 within a window, which in turn, substantially reduces the step coverage problems associated therewith.

Lower electrode 14 can be formed by conventional deposition processes from any metal suitable for conducting and holding an electric charge, such as aluminum, copper, silver, titanium, or noble metals such as gold, platinum, palladium, and the like. Preferably, however, lower electrode 14 is a multilayered structure comprising a layer 14a of titanium (Ti) overcoated with layer 14b of titanium nitride (TiN). The lower electrode 14 may range in thickness from about 0.04 microns to about 0.15 microns, with the Ti layer 14a ranging in thickness from about 0.01 microns to about 0.05 microns, and the TiN layer ranging in thickness from about 0.03 microns to about 0.10 microns.

Capacitor dielectric layer 16 may be formed from any suitable dielectric, such as silicon dioxide, silicon nitride or tantalum pentoxide, and can generally range in thickness from about 0.01 microns to about 0.10 microns depending on the electrical requirements of the capacitor 10.

The upper electrode 18 of the capacitor 10 may be any metal suitable for fabricating capacitors on integrated circuits. However, aluminum is a preferred metal for fabricating top plate 18. The aluminum may optionally be doped with, for example, copper or silicon, or alternatively may be part of a multilayered metal system.

Figure 2:
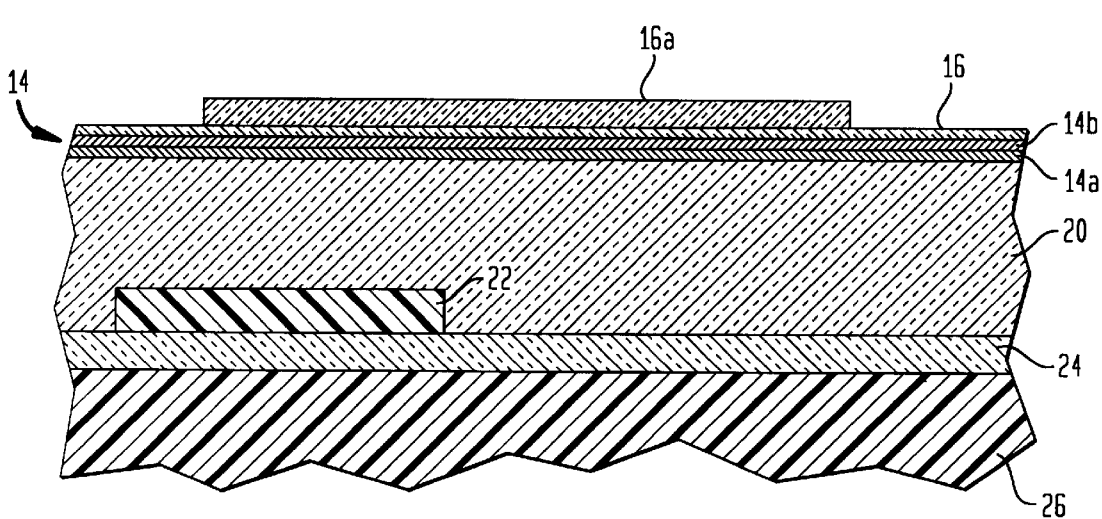
FIG. 2 illustrates a schematic cross-sectional diagram of the masked capacitor dielectric deposited on the lower electrode.

Referring to FIG. 2, the polysilicon layer 22 is patterned over the dielectric layer 24 using conventional processes well known to those skilled in the art. The dielectric layer 24 is formed on the silicon substrate 26 in a manner well known in the art, such as local oxidation or by deposition processes. Then, the interlevel dielectric layer 20 is deposited in an appropriate pattern to insulate the polysilicon layer 22 from overlying metallization. The interlevel dielectric layer 20 is preferably silicon dioxide, which may optionally be doped, or may optionally be silicon nitride or any other material having properties suitable for the use described herein. The dielectric layer 20 is then deposited over the prior level or levels to form the foundation layer on which the capacitor of the present invention is to be deposited.

The polysilicon 22 is preferably heavily doped to be conductive, as in conventional integrated circuits. Generally the polysilicon layer 22 will be n-doped either by diffusion, ion implantation, or by in-situ doping. It should be noted that polysilicon layer 22 does not serve as the bottom plate of capacitor 10 and hence is optional. However, in other embodiments as set forth in the incorporated U.S. application Ser. No. 08/472,033, it may serve as a lead to conduct electric charge to and from the bottom layer 14 and thereby facilitates the incorporation of capacitor 10 into an integrated circuit. In contrast to the method disclosed in U.S. Pat. No. 5,108,941, the polysilicon layer 22 herein does not need to be silicided to achieve optimum VOC performance of the capacitor 10. Moreover, other conductive materials may be substituted for polysilicon, such as aluminum copper, silver, titanium, or noble metals such as gold, platinum, palladium, and the like.

Continuing to refer to FIG. 2, the interlevel dielectric material 20 may be any dielectric material used in the manufacture of integrated circuits or semiconductor devices. However, in one embodiment, the dielectric material 20 is deposited by chemical vapor deposition ("CVD") from a silicon based material, such as tetraethyloxysilane ("TEOS") to yield a deposited silicon dioxide dielectric layer. While FIG. 2 shows the surface of the dielectric material 20 to be smooth, it is well known that after deposition processes, the surface may be irregular or bumpy in that it may slightly reflect underlying structures in the surface of the dielectric material. If desired, the surface may be polished with processes known to those who are skilled in the art, such as chemical/mechanical polishing (CMP) to remove these natural surface irregularities, however, the polishing is not necessary in that the natural surface irregularities provides a substantially planar surface on which the capacitor dielectric 16 may be uniformly deposited.

After the dielectric material 20 is deposited, the lower electrode 14 of the capacitor 10 is formed over the dielectric material 20 by depositing a layer of 14a of titanium (Ti) and 14b of titanium nitride (TiN), preferably by sputter deposition to form the structure illustrated in FIG. 2. The titanium nitride may be deposited in-situ after a certain thickness of titanium metal has been deposited by bleeding nitrogen gas into the titanium sputtering chamber. Thus, the titanium nitride forms a coating which covers the titanium and serves as an etch stop for later processing steps as discussed below.

Next, the capacitor's dielectric layer 16 is deposited over the integrated circuit device 12. In preferred embodiments, the capacitor dielectric 16 is formed by first depositing TEOS on the layer 14 of Ti/TiN by means of chemical vapor deposition or plasma enhanced chemical vapor deposition ("PECVD"). The TEOS decomposes to form an adherent dielectric layer 16 of $SiO_2$. Although the capacitor dielectric is discussed herein as being silicon dioxide, it should be understood that other materials can also function as capacitor dielectrics. For example, the capacitor dielectric 16 can be formed from silicon nitride or ferroelectric material such as $BaTiO_3$. Following this, the capacitor dielectric layer 16 is then masked using a photoresist 16a, which is used to delineate the edges of the capacitor dielectric layer 16. It should be noted that in the embodiment as illustrated in FIG. 2, the capacitor dielectric layer 16 is not deposited in an opening, such as a window or via. In other words, the surface on which the entire surface area of the capacitor dielectric layer 16 is deposited lies substantially within the same plane, with the exception, of course, for natural surface irregularities, such as those discussed above. This provides certain advantages over conventional integrated circuits in that the substantially planar surface allows the capacitor dielectric layer 16 to be more uniformly deposited, which can reduce voltage breakdown within the device.

Figure 3:
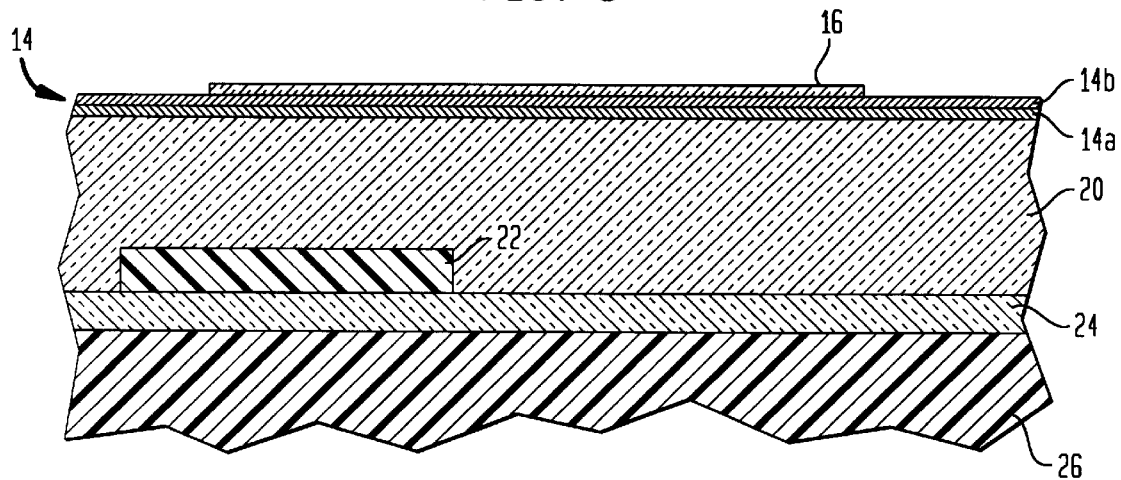
FIG. 3 illustrates a schematic cross-sectional diagram of etched capacitor dielectric deposited on the lower electrode.

The capacitor dielectric layer 16 is then etched away with, for example, a wet etch such as ethylene glycol/buffered hydrogen fluoride solution, or a dry etch such as reactive sputter etching, resulting in the structure illustrated in FIG. 3. The TiN is resistant to such etches and functions as an etch stop.

Figure 4:
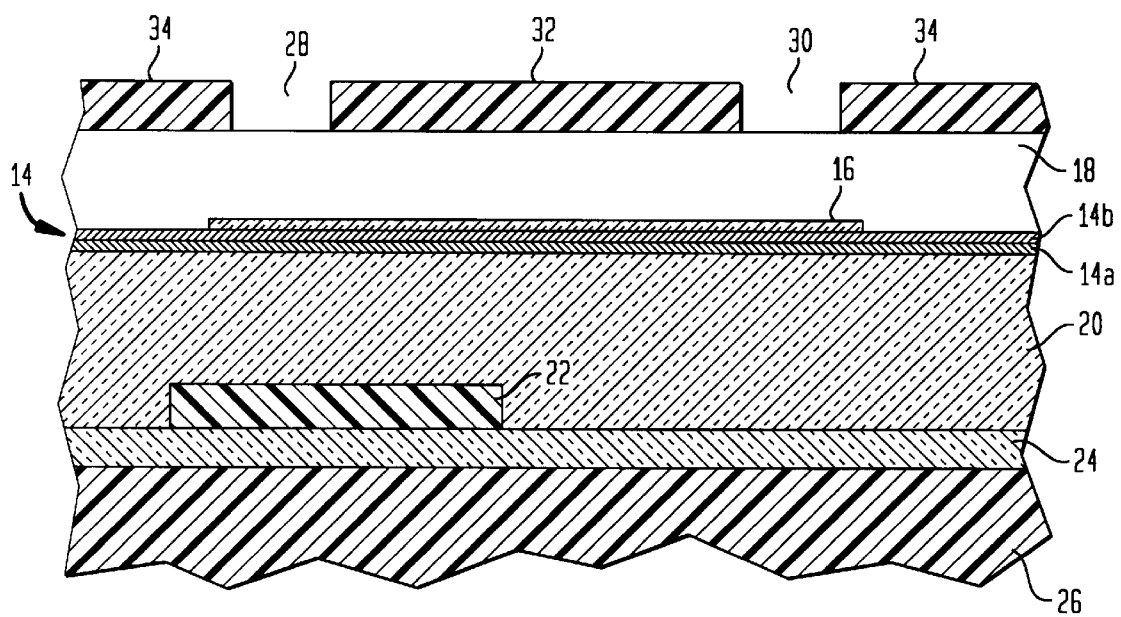
FIG. 4 illustrates a schematic cross-sectional diagram of the device of FIG. 3 with the masked upper electrode deposited thereon.
Figure 5:
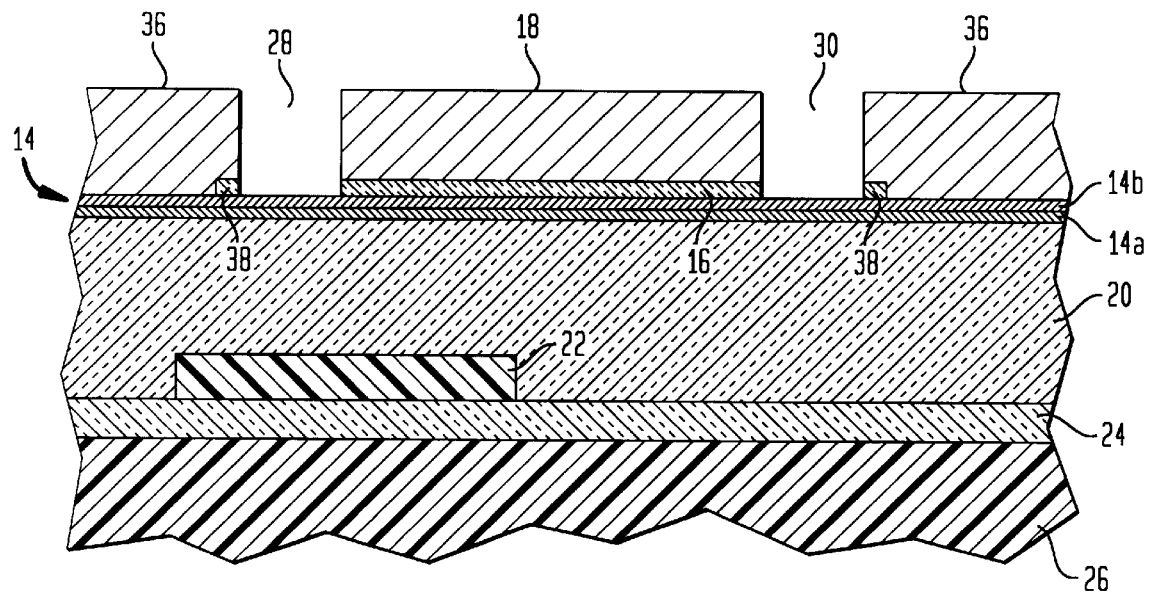
FIG. 5 illustrates a schematic cross-sectional diagram of the device of FIG. 4 with the etched upper electrode and capacitor dielectric to define the capacitor.

In the next step, the photo resist 16a is stripped off and the upper electrode 18, which is preferably comprised of aluminum ("Al"), is conventionally deposited as illustrated in FIG. 4. The lower and upper electrodes 14 and 18 are then patterned with one mask to form photoresist portions 32 and 34, which are exposed and developed in accordance with conventional photolithography techniques to define gaps 28 and 30. The etching process is continued until the upper electrode 18 is etched down to the lower electrode 14. The resulting capacitor 10 is formed in the areas with the remaining capacitor dielectric 16 in which the capacitor layers are titanium—titanium nitride—silicon dioxide aluminum. In addition, other metal portions 36 (see FIG. 5), which may be positioned on either side of the capacitor 10 and which are not part of the capacitor 10, are also formed. The metal portions 36 may be used to make contact with the lower electrode 14 and may be used to make connection to a prior level by a via or other contact opening. The photoresist portion 32, which defines the limits of the capacitor 10, terminates on the dielectric layer 16. The metal portions 36 together with lower electrode 14 form a runner for conducting current to other portions of the integrated circuit. As illustrated in FIG. 5, a small portion 38 of the capacitor dielectric 16 may be present in the metal portion 36. This is the result of extending the capacitor dielectric 16 sufficiently to account for any inaccuracies in the patterning and etching processes.

The aluminum is over-etched sufficiently to remove it and the capacitor dielectric layer 16 at the gaps 28 and 30 to the lower electrode 14, as explained above. Then photoresist portions 32 and 34 are stripped, which results in the structure illustrated in FIG. 5. Because of the very close metal to metal spacing between the large Al metal features, there is a proximity effect in the etching of the metal; that is, the etch rate is reduced so that it does not etch down through the lower electrode 14, thereby allowing the two metal features to be positioned more closely together. If desired, another dielectric layer can then be deposited over the structure of FIG. 5 to achieve a multi-level integrated circuit generally illustrated in FIG. 1.

Figure 5A:
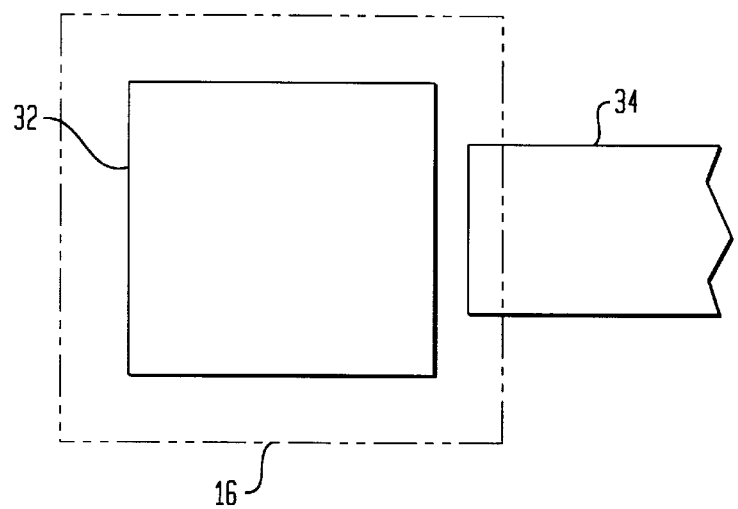
FIG. 5A illustrates a schematic top view of the photoresist material used to define both lower and upper electrodes.

As mentioned above, one mask is used to define photoresist portions 32 and 34, which are used to both define the upper and lower electrodes 18 and 14, as well as the contacts (i.e., other metal portions 36) to the lower electrode 14, as illustrated in FIG. 5A, which results in the above-discussed self-aligned capacitor. This aspect is particularly advantageous for ease of manufacture. The non-critical nesting tolerance of upper and lower electrodes 18 and 14 to capacitor dielectric 16 imposes no additional alignment constraints on lithography for the capacitor. Because contacts 36 are self-aligned to lower electrode 14, without the need for a window or other contact opening, improvement in circuit packing density can be realized through reduced capacitor contact layout area.

In one embodiment, the capacitor dielectric layer 16 acts as an etch stop for the lower electrode 14 in that it prevents the etch from removing the lower electrode 14. In one advantageous embodiment, the lower and upper electrodes 14 and 18 are simultaneously masked, patterned and etched. As such, they initially cover the same surface area within the integrated circuit 12. As the lower and upper electrodes 14 and 18 are etched, the etching process encounters the capacitor dielectric 16 in those portions where gaps 28 and 30 are to be formed. The capacitor dielectric 16 has a slower etch rate than the upper electrode 18, and consequently, slows down the etching process in the area covered by the capacitor dielectric 16. However, where the capacitor dielectric 16 is not present, the etching process proceeds through the lower electrode 14 to define its outer boundaries in those portions of the device, which are not shown in FIG. 5. Thus, after the etch process, the lower electrode 14 is left in the gaps 28 and 30 where the capacitor dielectric 16 overlaid it, resulting in the lower electrode 14 extending beyond the common area 10a of the capacitor 10.

From the foregoing, it is seen that the present invention provides, for use in an integrated circuit structure having a prior level that includes a foundation dielectric formed over a conductive polycrystalline material, a capacitor comprising first and second electrodes having a capacitor dielectric formed therebetween. The first electrode is formed immediately over the prior level and extends beyond a common area of the first and second electrodes and connects the capacitor to the prior level outside of the common area. The capacitor is free of a direct electrical contact with the prior level; that is, the capacitor is not connected to the prior level by a window or other interconnect structure that extends directly from the capacitor itself within the common area. Electrical connection of the capacitor to the prior level is made outside the common area of the capacitor.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

What is claimed is:

1. For use in an integrated circuit structure having a prior level that includes a foundation dielectric, a capacitor comprising:

substantially planar first and second electrodes having a capacitor dielectric formed there between, said first electrode formed immediately over said prior level and a portion of said first electrode overlapping said second electrode to define a common area, said first electrode:
extending beyond said common area, and
connecting said capacitor to said prior level outside said common area; and a contact metal located on the same level as and in close proximity to said capacitor and on a portion of said first electrode that extends beyond said common area, thereby to improve a circuit packing density of said integrated circuit structure.

2. The capacitor of claim 1 wherein said capacitor is substantially planar.

3. The capacitor of claim 1 wherein said first electrode is comprised of first and second layers of conductive material.

4. The capacitor of claim 3 wherein said first layer is comprised of titanium and said second layer is comprised of titanium nitride.

5. The capacitor of claim 1 wherein said second electrode is comprised of aluminum.

6. The capacitor of claim 1 wherein said capacitor dielectric is comprised of silicon dioxide.

7. The capacitor of claim 1 wherein said capacitor is electrically connected to said prior level by a window located outside said common area.

8. The capacitor of claim 7 wherein said first electrode extends over said window thereby to indirectly connect said capacitor to said prior level.

9. The capacitor of claim 1 wherein said capacitor is self-aligned.

10. For use in an integrated circuit structure having a prior level and a dielectric layer formed over said prior level, a capacitor, comprising:

a uniformly planar first electrode formed on a planarized surface of said dielectric layer and having a first electrode footprint that extends beyond a common area of said capacitor, said first electrode electrically connecting said capacitor to said prior level outside said common area from said planarized surface;

planar second electrode formed over said first electrode and having a second electrode footprint that co-terminates with said common area;

a capacitor dielectric formed between and in contact with said first electrode and said second electrode and having a capacitor dielectric footprint that co-terminates with said second electrode footprint; and a planar contact formed on said first electrode outside said common area of said capacitor and on said planarized surface and in close proximity to said common area, thereby to improve a circuit packing density of said integrated circuit structure.

* * * * *